(12) United States Patent
Miller et al.

(10) Patent No.: US 7,723,810 B2
(45) Date of Patent: May 25, 2010

(54) INTEGRATED ELECTRICAL CROSS-TALK WALLS FOR ELECTROSTATIC MEMS

(75) Inventors: John Michael Miller, Gatineau (CA); Steven Harold Moffat, Mississippi Mills (CA)

(73) Assignee: JDS Uniphase Corporation, Milpitas, CA (US)

( * ) Notice: Subject to any disclaimer, the term of this patent is extended or adjusted under 35 U.S.C. 154(b) by 98 days.

(21) Appl. No.: 12/184,288

(22) Filed: Aug. 1, 2008

(65) Prior Publication Data

US 2009/0071708 A1    Mar. 19, 2009

Related U.S. Application Data

(60) Provisional application No. 60/954,372, filed on Aug. 7, 2007.

(51) Int. Cl.
*H01L 29/72* (2006.01)
(52) U.S. Cl. .................. 257/414; 257/415; 257/420; 200/181

(58) Field of Classification Search ................. 257/414, 257/415, 420; 200/181
See application file for complete search history.

(56) References Cited

U.S. PATENT DOCUMENTS 6,934,439 B2 * 8/2005 Mala et al. ................... 385/18
7,110,635 B2 * 9/2006 Miller et al. .................. 385/18

* cited by examiner

*Primary Examiner*—Edward Wojciechowicz
(74) *Attorney, Agent, or Firm*—Teitelbaum & MacLean; Neil Teitelbaum; Doug MacLean

(57) ABSTRACT

To reduce cross-talk between adjacent hot electrodes, the present invention provides a ground plane, which extends beneath each side of a MEMS mirror platform covering opposite edges of a hot electrode along each side thereof. The ground plane includes an overhang section extending between the mirror platform and the hot electrode forming a first gap between the hot electrode and the overhang section, and a second gap between the overhang section and the mirror platform. The method of the present invention enables highly accurate construction using lithographic patterning and deep reactive ion etching (DRIE).

6 Claims, 9 Drawing Sheets

Step 1 : Electrode Patterning

Step 2 : Ground Plane pattern and etch.

Step 3 : Anodic Bond 1 (GP + Electrode)

Step 4 : Handle etch back 1

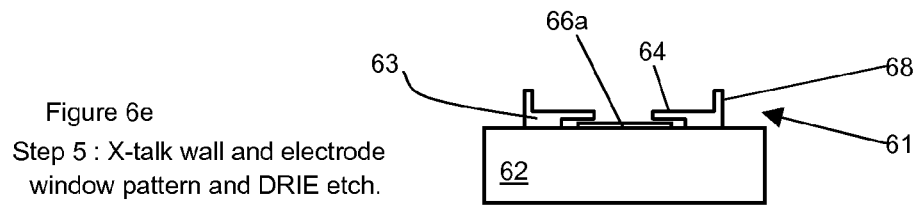
Figure 6e
Step 5 : X-talk wall and electrode window pattern and DRIE etch.
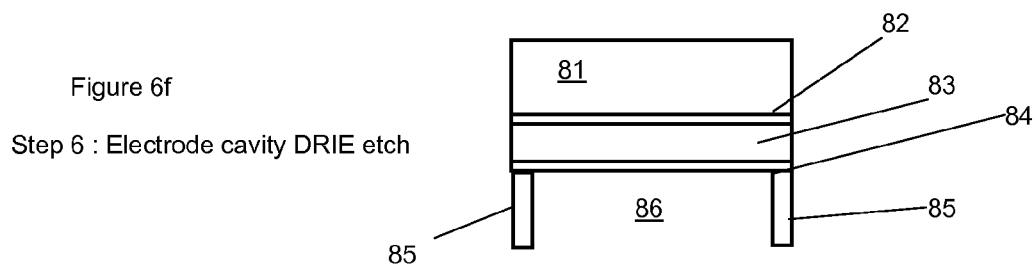
Figure 6f
Step 6 : Electrode cavity DRIE etch
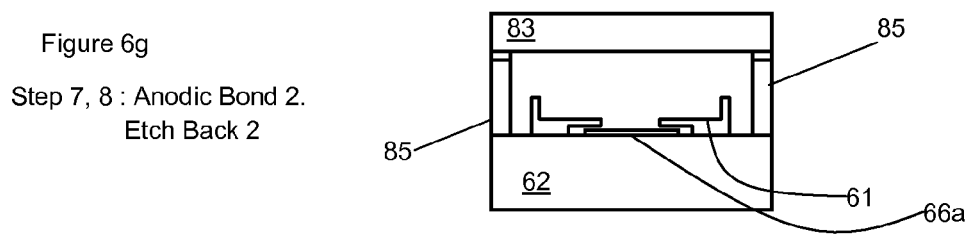
Figure 6g
Step 7, 8 : Anodic Bond 2. Etch Back 2
Figure 6h
Step 9, 10 : Mirror release, Metalisation
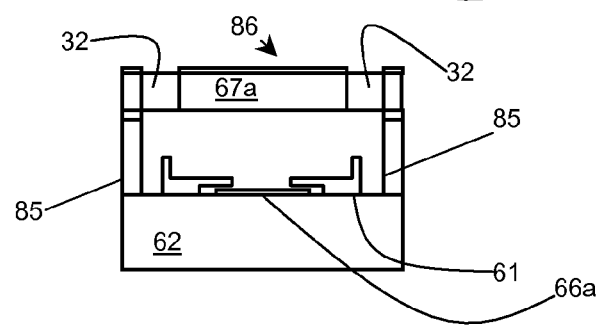

Step 1 : Electrode Patterning

Step 2a : Ground Plane pattern First etch.

Step 2b : Ground Plane pattern Second etch

Step 3 : Anodic Bond 1

(GP + Electrode)

Step 4 : Remove Handle

Step 5 : Electrode cavity DRIE etch

Step 6, 7 : Anodic Bond 2.
Etch Back 2

Step 8, 9 : Mirror release, Metalization

INTEGRATED ELECTRICAL CROSS-TALK WALLS FOR ELECTROSTATIC MEMS

CROSS-REFERENCE TO RELATED APPLICATIONS

This application claims priority of U.S. Provisional Patent Application No. 60/954,372 filed Aug. 7, 2007, entitled "INTEGRATED ELECTRICAL CROSS-TALK WALLS FOR ELECTROSTATIC MEMS" which is incorporated herein by reference for all purposes.

TECHNICAL FIELD

The present invention relates to a bulk micro-machined ground plane with integrated cross-talk walls for use with electrostatic MEMS electrodes, and in particular to an integrated design for a shield electrode that shields the electric field driving a micro-mirror both from the changing conductivity of the surrounding dielectric surfaces and the changing electric field conditions in adjacent micro-mirrors. The present invention also relates to a method for fabricating the shield electrode configuration using bulk micro-machining technology.

BACKGROUND OF THE INVENTION

Conventional optical switches based on micro-electro-mechanical (MEMS) actuated tiltable micro-mirrors in a linear micro-mirror array having a PIANO MEMS configuration, are detailed in U.S. Pat. No. 6,934,439 Mala et al, which is incorporated herein by reference.

An array of "Piano" MEMs mirror devices 21, 22 and 23, which pivot about a single axis of rotation $\theta_y$ above a substrate 25, is illustrated in FIGS. 1 and 2. Each mirror device 21, 22 and 23 includes a pivoting platform 26 defined by first and second substantially-rectangular planar supporting regions 27 and 28 joined by a relatively-thin substantially-rectangular brace 29 extending therebetween. Typically, each planar surface 27 and 28 is coated with a reflective coating, e.g. gold, for simultaneously reflecting a pair of sub-beams of light traveling along parallel paths, as will be hereinafter discussed. Each brace 29 acts like a lever and is pivotally mounted on C or I-shaped anchor posts 30 and 31 via first and second torsional hinges 32 and 33, respectively. The anchor posts 30 and 31 extend upwardly from the substrate 25. The ends of the first torsional hinge 32 are connected to the anchor post 30 and the brace 29 along the axis $\theta_y$. Similarly, the ends of the second torsional hinge 33 are connected to the anchor post 31 and the brace 29 along the axis $\theta_y$. Preferably, each of the first and second torsional hinges 32 and 33 comprises a serpentine hinge, which are considerably more robust than conventional torsional beam hinges. The serpentine hinge is effectively longer than a normal torsional hinge, which spans the same distance, thereby providing greater deflection and strength, without requiring the space that would be needed to extend a normal full-length torsional hinge.

A consequence of closely packed micro-mirrors is that the actuation of a single mirror will impart a torque, i.e. an angular rotation, onto adjacent mirrors as a result of fringing electric fields. In an effort to minimize this electrical cross-talk, electrode grounding shields 41, see FIG. 2, are positioned on the substrate 25 on either side of the first and second electrodes 36 forming electrode cavities, which are electrically isolated from each other. The electrode grounding shields 41 extend the length of the first electrodes 36, perpendicular to the axis of rotation $\theta_y$ of the platforms 26. The walls of the electrode grounding shields 41 extend upwardly above the upper plane of the first electrodes 36. The grounding shields 41 are kept at ground potential, i.e. the same as the mirrored platforms 26, while one of the first and second electrodes is held at an activation voltage, e.g. 100 Volts.

FIG. 3 illustrates an array of internal gimbal ring MEMs mirror devices 51 utilizing a first pair of serpentine torsional hinges 52a and 52b for pivoting a rectangular platform 53 about a first axis of rotation $\theta_y$, and a second pair of serpentine torsional hinges 54a and 54b for rotating the platform 53 about a second perpendicular axis of rotation $\theta_x$ above a base substrate 55. The first pair of serpentine torsional hinges 52a and 52b extend from a single anchor post 56, which extends upwardly from the base substrate 55 through the center of the platform 53, i.e. at the intersection of the minor (lateral) and major (longitudinal) axes of the platform 53. Outer ends of the first pair of torsional serpentine hinges 52a and 52b are connected to a rectangular gimbal ring 58, which surrounds the first pair of serpentine hinges 52a and 52b, at points along the minor axes ($\theta_y$) of the platform 53. The second pair of serpentine torsional hinges 54a and 54b extend from opposite sides of the gimbal ring 58 into contact with the platform 53, at points along the major axis ($\theta_x$) of the platform 53.

The problem with conventional MEMS mirrors is the angular stability of the micro-mirrors in the micro-mirror array, wherein the angular position of the micro-mirrors drifts due to changes in the surface conductivity of the surrounding dielectric surfaces. The angular position of the micro-mirrors is also affected by the changing electric fields (cross-talk) in adjacent micro-mirrors of the array.

An object of the present invention is to overcome the shortcomings of the prior art by providing a bulk micro-machined ground plane with integrated cross-talk walls for use with electrostatic MEMS electrodes.

SUMMARY OF THE INVENTION

Accordingly, the present invention relates to a micro-electro-mechanical device comprising:

a substrate;

a moving member mounted above the substrate;

a hot electrode supported on the substrate for applying a force to the moving member to control the position thereof, the hot electrode extending upwardly defining a first level;

a grounded shield comprising a base section extending longitudinally along a side of the hot electrode and upwardly above the first level, and an overhang section extending laterally from the base section over top of an edge of the hot electrode between the hot electrode and the moving member, thereby shielding the moving member from any electric field variations induced by oxide surface conductivity changes at a junction of the hot electrode and the substrate.

BRIEF DESCRIPTION OF THE DRAWINGS

The invention will be described in greater detail with reference to the accompanying drawings which represent preferred embodiments thereof, wherein:

FIGS. 6a to 6h illustrate a method of manufacturing the MEMS device of FIG. 4.

DETAILED DESCRIPTION

Figure 4:
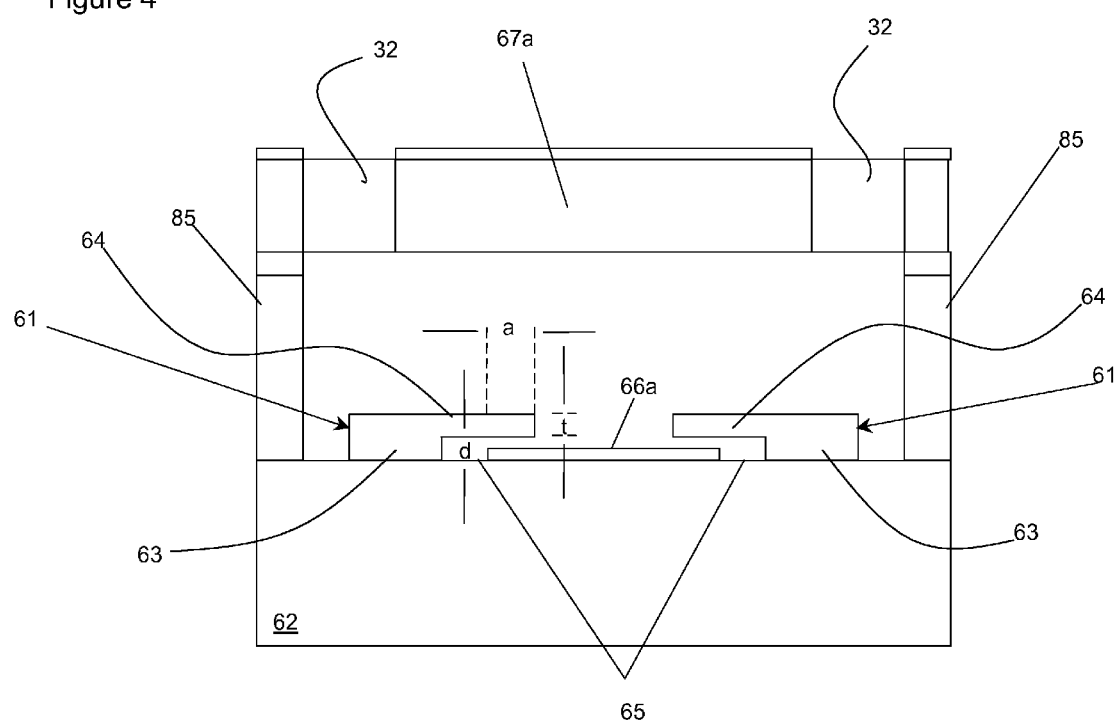
FIG. 4 is a side view of the MEMS device in accordance with the present invention.
Figure 5:
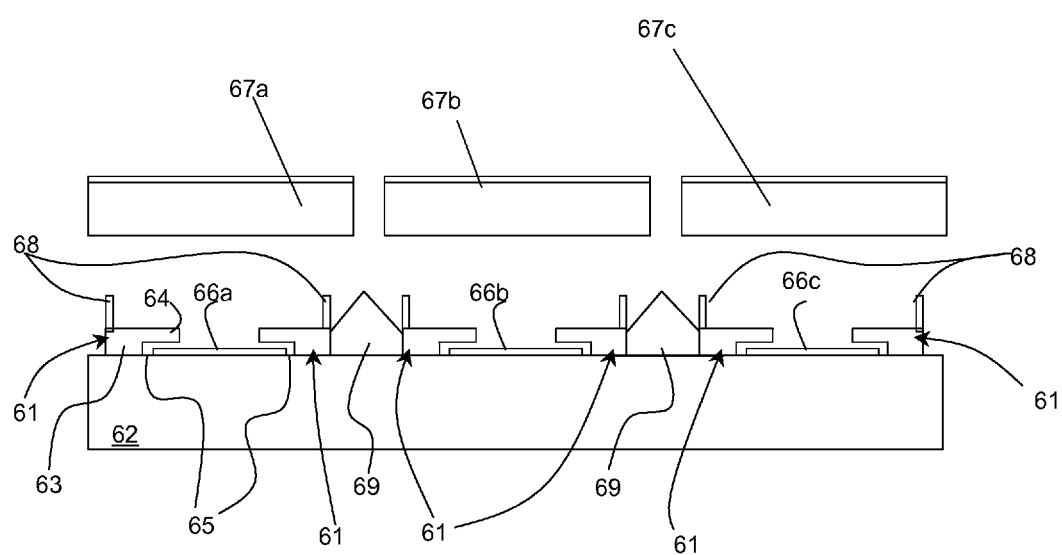
FIG. 5 is a side view of a MEMS array in accordance with the present invention.

With reference to FIGS. 4 and 5, the present invention relates to bulk micro-machined electrode ground plane shields 61 mounted on a substrate wafer 62, which is preferably a planar oxide or Pyrex surface. Alternatively, the substrate wafer 62 could be a silicon wafer, preferably with an isolating layer, or a silicon on insulator (SOI) wafer structure. Each of the ground plane shields 61 includes a main, generally rectangular, base section 63 extending longitudinally on the substrate wafer 62 along the side of electrodes 66a to 66c, and upwardly from the substrate wafer 62 to a level above the level of the upper surface of the electrodes 66a to 66c. A horizontal rectangular overhang section 64, with planar upper and lower surfaces parallel to the substrate, extends laterally and outwardly from the base section 63 parallel to the substrate wafer 62 and over an edge of the hot electrodes 66a to 66c by a length "a". The overhang sections 64 have a thickness "t", and extend a distance "d" above the substrate 62, whereby they are separate and spaced from the hot electrodes 66a to 66c in a gap between the hot electrodes 66a to 66c and a MEMS moving member 67a. One of the ground plane shields 61 extends beneath each side of each MEMS moving member, e.g. mirror platforms 67a, 67b and 67c, covering opposite edges of the hot electrodes 66a, 66b and 66c.

The ground plane shields 61 are typically formed in silicon, or other suitable material, and may also include electrical cross-talk walls 68 extending upwardly from the base section 63 perpendicular to the overhang section, see FIG. 5. The ground plane shields 61 are aligned above the upper surface of the "hot" electrode 66a such that any planar oxide or Pyrex surfaces 65 of the substrate wafer 62 proximate the junction with the edges of the hot electrodes 66a, 66b and 66c are substantially shielded from the opposite (moveable) electrode surface of the MEMS mirror 67a. In this manner, the positional stability of the MEMS mirrors 67a to 67c is improved during extended actuation, because the MEMS mirrors 67a to 67c are shielded from any electric field variations induced by oxide surface conductivity changes at the junction 65 of the hot electrode 66a and the substrate 62.

An advantage of such an approach is that the key topographical parameters of the ground plane shields 61, such as the overhang length "a", the ground plane thickness "t" and electrode-ground plane gap "d", see FIG. 4, are defined by lithographic patterning and deep reactive ion etching (DRIE) in, for example, a silicon-on-insulator (SOI) layer. Accordingly, a MEMS designer is less constrained when choosing the "a", "t" and "d" parameters than with a surface micromachined process. Furthermore, any irregularities in sidewall geometry can be avoided since a nominally anisotropic etch is employed to define the ground plane shields 61 with vertical "smooth" surfaces. Accordingly, the ground plane shields 61 can be precisely formed in a single layer, and each ground plane shield 61 can have a unitary construction.

Figure 1:
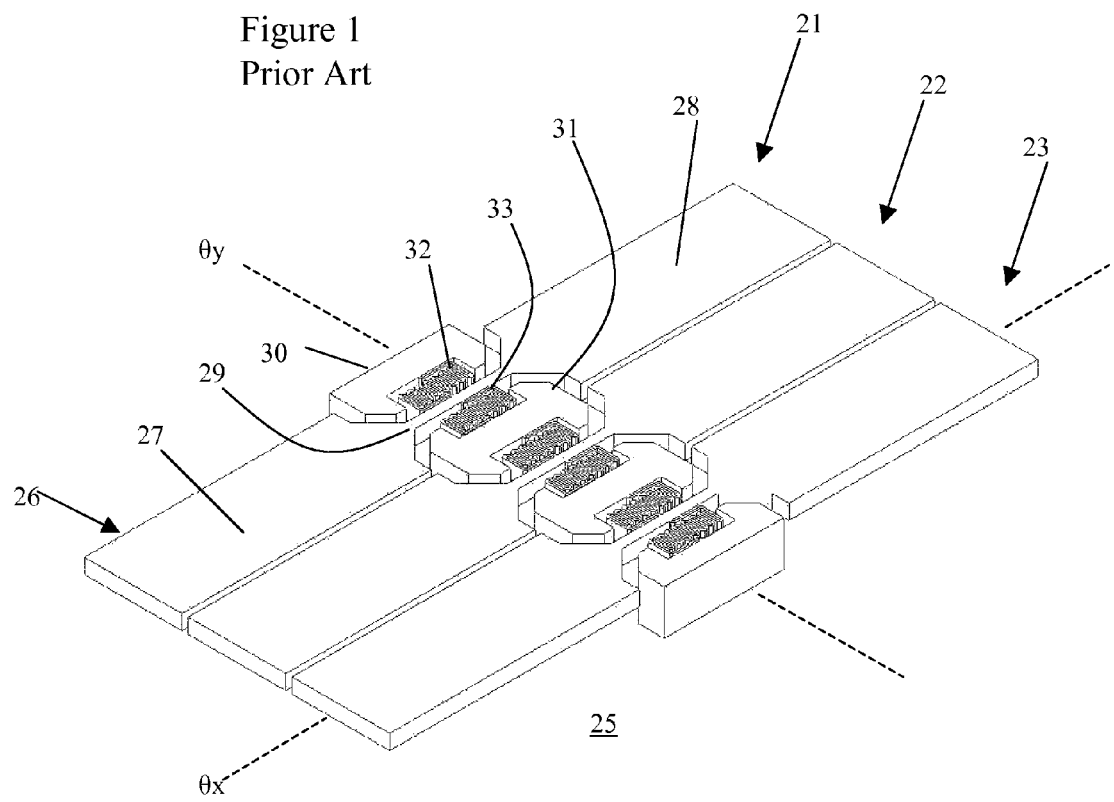
FIG. 1 is an isometric view of a conventional piano MEMS mirror array.
Figure 2:
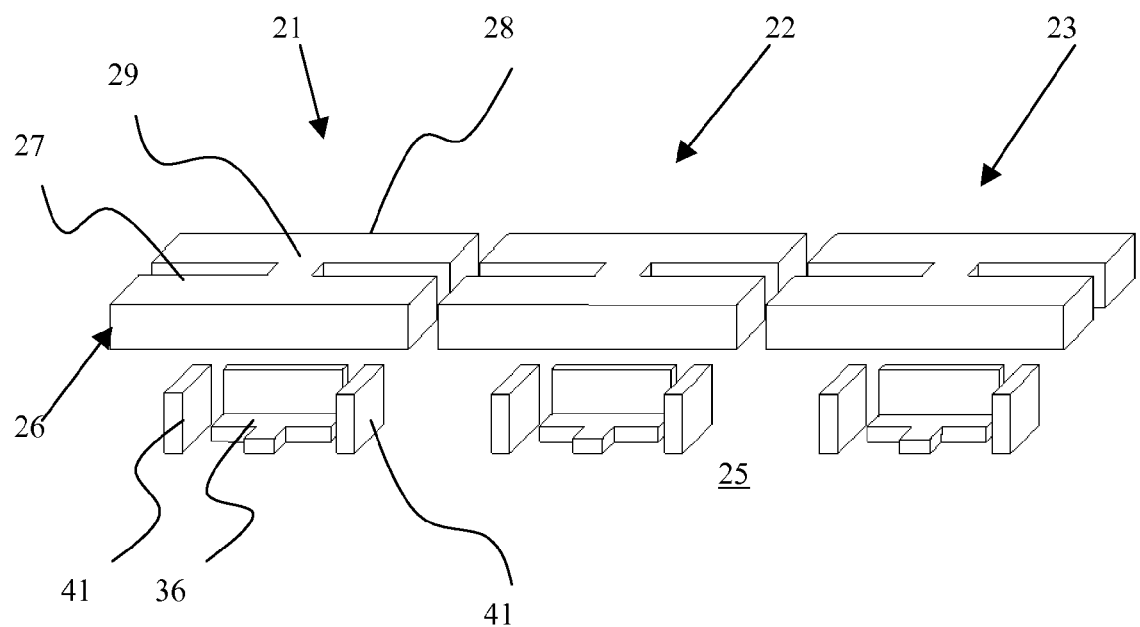
FIG. 2 is an isometric view of a conventional piano MEMS mirror array including electrodes with cross-talk shields.
Figure 3:
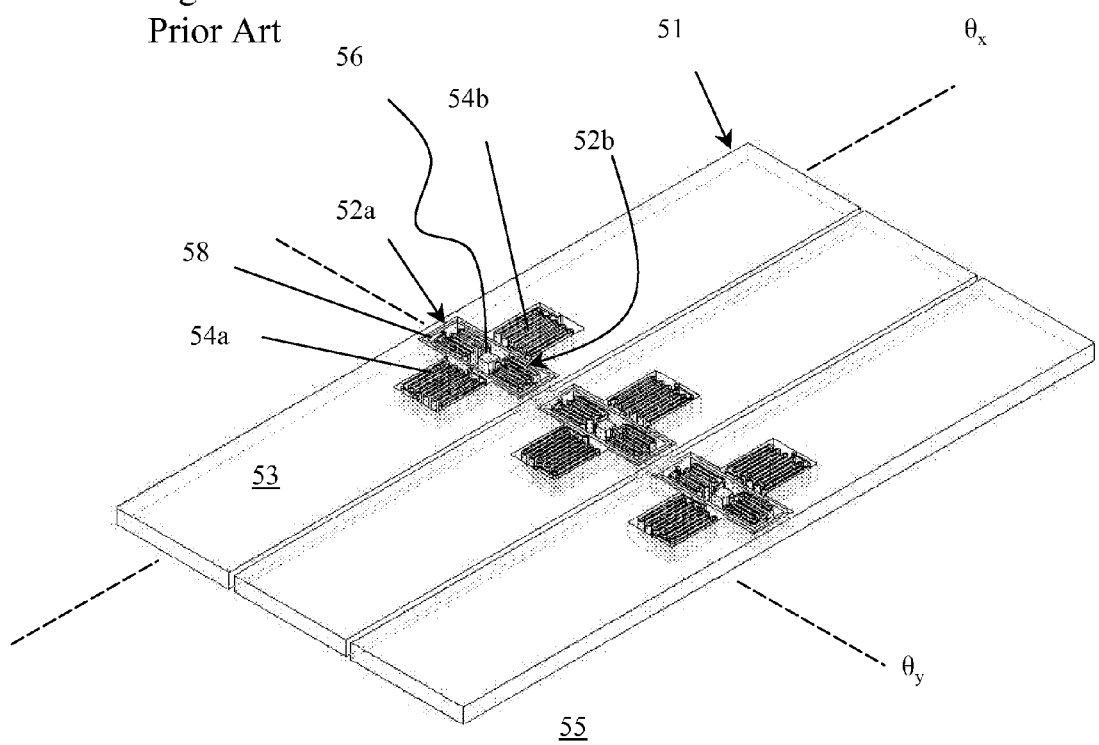
FIG. 3 is an isometric view of a conventional piano MEMS mirror array including a gimbal structure for pivoting the mirrors about two perpendicular axes.

The MEMS mirrors 67a to 67c can be the aforementioned piano MEMS mirrors illustrated in FIGS. 1 to 3 or any other tilting or pistoning MEMS device. Accordingly, the hinges can be any of the aforementioned hinges or hinge structures, e.g. serpentine torsional hinges 32, 33, 52a, 52b, 54a and 54b, or any other suitable hinge structure, supported by one or more vertical posts 85, e.g. posts 30 and 31 from FIG. 1 or post 56 from FIG. 3.

Figure 6A:
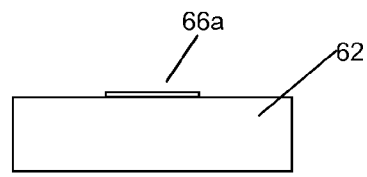
Figure 6B:
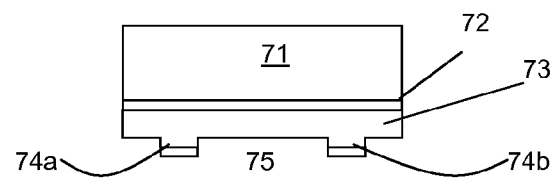
Figure 6C:
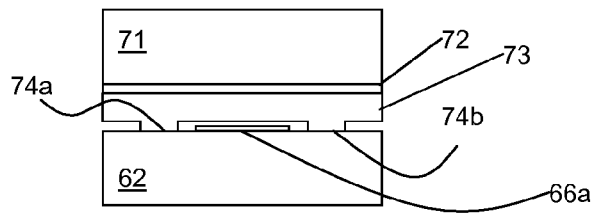
Figure 6D:
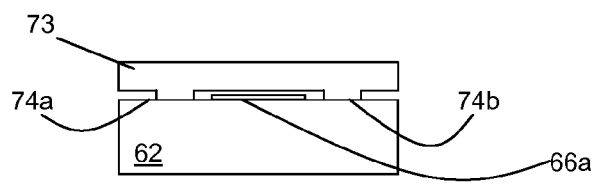
Figure 7A:
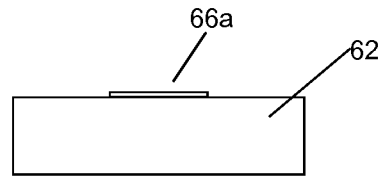
FIGS. 7a to 7h illustrate an alternate method of manufacturing the MEMS device of FIG. 4.
Figure 7B:
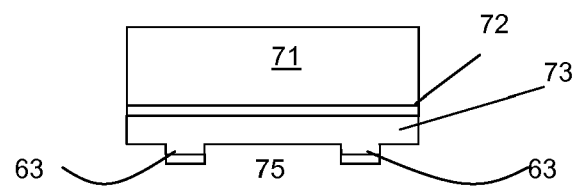
Figure 7C:
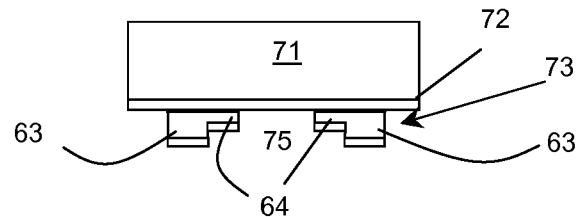
Figure 7D:
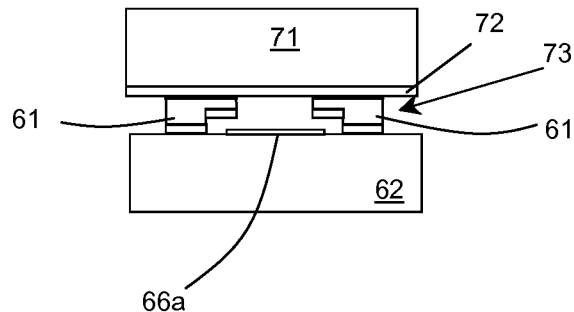
Figure 7E:
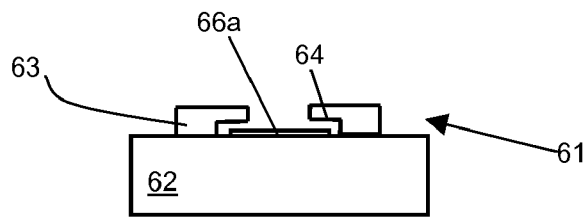
Figure 7F:
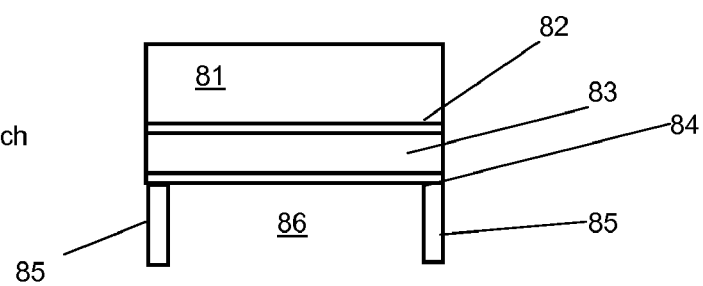
Figure 7G:
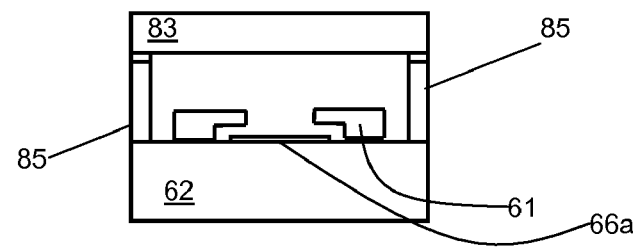
Figure 7H:
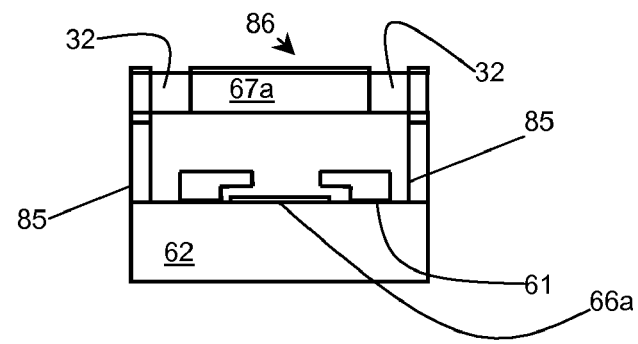

The addition of vertical electrical cross-talk walls 68, as is shown in FIG. 5, which minimize or lessen the amount of cross-talk between adjacent hot electrodes 66a and 66b, would also enable the inclusion of inter mirror back-reflection features, such as back-reflection cusps 69, disclosed in U.S. Pat. No. 7,110,635 issued Sep. 19, 2006 to Miller et al, which is incorporated herein by reference, having at least one surface at an acute angle to the substrate 62 for redirecting any light passing between the MEMS mirror platforms 67a, 67b and 67c, thereby eliminating back reflection thereof A possible process flow for the ground plane, e.g. silicon, with integrated x-talk walls 68 is shown schematically in FIGS. 6a to 6h. In the first step, illustrated in FIG. 6a, one of the hot electrodes, e.g. 66a is patterned on the un-etched planar substrate surface 62. In a second step (FIG. 6b), a carrier wafer 71, e.g. silicon-on-insulator (SOI), with a release layer 72 is used to mount a ground plane shield layer, e.g. silicon, layer 73, which will be etched to define the ground planes 61. Initially, the bottom of the ground shield layer 73 is etched to form two elongated pedestals 74a and 74b with a gap 75 therebetween. The pedestals 74a and 74b have a height "d", and form the base section of the ground plan shields 61. A bonding step, e.g. anodic bonding, (FIG. 6c) attaches the pedestals 74a and 74b to the substrate 62 with the electrode 66a in the gap 75, thereby enabling the inclusion of the bulk micro-machined ground plane shields 61 above the electrodes, e.g. hot electrode 66a. The next step (FIG. 6d) is to remove the carrier wafer 71 and the release layer 72, and then (FIG. 6e) to pattern and etch the ground plane layer 73 to form the ground planes 61 with the base section 63, and the horizontal 64 and vertical 68 (optional) cross-talk shields. Self aligned masking can be used. A pair of ground plane shields 61 are formed, one on each side of the hot electrode 66a with a gap therebetween, exposing the central portion of the hot electrode 66a.

FIG. 6f illustrates the next step in which a multi-layer structure, such as a double silicon on insulator structure (DSOI) is used to form the mirror structures, e.g. 67a. The DSOI structure includes a silicon carrier wafer 81 with a first insulator release layer 82, which are used to support a structural layer 83, e.g. silicon, which will be etched to define the mirrors, e.g. 67a, and a second insulator release layer 84. Vertical mounting or spacer posts 85 are provided either by etching away another silicon layer provided on the second insulator layer 84 or by a separate bonding step. The posts 85 can be in the form of a single post, e.g. post 56 for mirrors 51 (FIG. 3) pivoting about two axes or in the form of dual posts, e.g. posts 30 and 31 for mirrors 21 to 23 (FIGS. 1 and 2). The posts 85 support the mirror structures above the substrate 62 forming a cavity 86 therebetween In the next step (FIG. 6g) the release layer 84 is removed, the posts 85 are bonded, e.g. anodic, to the substrate 62, and the carrier wafer 81 and the first release layer 82 is removed. In the final step (FIG. 6h), the silicon structural layer 83 is etched to form the mirror platforms 67a with hinges, e.g. 32, 33, 52a, 52b, 54a and 54b, thereby releasing the mirror platform 67a for rotation. A reflective layer 86, e.g. gold or some other metal layer can be coated onto the required surfaces of the mirror 67a.

In an alternative embodiment, illustrated in FIGS. 7a to 7h, in which the cross-talk shields 68 are not formed in the original etch, the first step of patterning the hot electrode 66a on top of the substrate 62, remains the same as above. The second step includes the multi-layer, e.g. DSOI, structure in which the etch stop layer 72 is sandwiched between the handle wafer layer 71 and the ground plane layer 73, as above; however, the etching process for the ground plane layer is divided into two steps illustrated in FIGS. 7b and 7c. The bases 63 for the ground plane shields 61 are patterned and formed in a first etching step, which removes the non-patterned sections of the ground plane layer 73 to the distance "d". The second step involves patterning the overhang sections 64 and etching down to the etch stop layer 72, which is the thickness "t" away, thereby removing the remainder of the ground plane layer, except the ground plane shields 61 with a gap 75 therebetween.

Step 3 (FIG. 7d) involves bonding, e.g. anodic, the base sections 64 of the ground plane shields 62 to the substrate on either side of the hot electrode 66a, whereby the overhang sections 64 overhang the edges of the hot electrode 66a. In the fourth step, the handle wafer 71 and etch stop layer 72 are removed leaving the ground plane shields 61 on the substrate 62. Cross talk shields 78 can be added in this step by a separate bonding step, if desired. The remaining steps 4 to 9 are identical to steps 5 to 10 above.

We claim:

1. A micro-electro-mechanical device comprising:
a substrate;
a moving member mounted above the substrate;
a hot electrode supported on the substrate for applying a force to the moving member to control the position thereof, the hot electrode extending upwardly defining a first level;
a grounded shield comprising a base section extending longitudinally along a side of the hot electrode and upwardly above the first level, and an overhang section extending laterally from the base section over top of an edge of the hot electrode between the hot electrode and the moving member, thereby shielding the moving member from any electric field variations induced by oxide surface conductivity changes at a junction of the hot electrode and the substrate.

2. The device according to claim 1, wherein the grounded shield electrode further comprises a cross-talk shield extending upwardly from the base section for minimizing electrical cross-talk between adjacent hot electrodes.

3. The device according to claim 1, wherein the grounded shield electrode further comprises surfaces at acute angles to the substrate for redirecting light passing by the moving member, thereby preventing back reflections.

4. The device according to claim 1, wherein the moving member is a platform pivotally connected to at least one post extending upwardly from the substrate.

5. The device according to claim 4, wherein the platform is pivotally connected to each post about a pivot axis via torsional hinges.

6. The device according to claim 4, wherein each platform is pivotally connected about a first axis via a first torsional hinge, and about a second axis perpendicular to the first axis via a second torsional hinge.

* * * * *